US010964037B2

(12) United States Patent
Chih et al.

(10) Patent No.: US 10,964,037 B2
(45) Date of Patent: Mar. 30, 2021

(54) OPTICAL PROJECTOR MODULE, THREE-DIMENSIONAL IMAGE SENSING APPARATUS, AND METHOD OF SENSING

(71) Applicant: Chiun Mai Communication Systems, Inc., New Taipei (TW)

(72) Inventors: Yu-Yang Chih, New Taipei (TW); Ming-Fu Tsai, New Taipei (TW); Hsueh-Feng Hsu, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 0 days.

(21) Appl. No.: 16/261,981

(22) Filed: Jan. 30, 2019

(65) Prior Publication Data
US 2019/0251699 A1    Aug. 15, 2019

(30) Foreign Application Priority Data

Feb. 12, 2018  (CN) .......................... 201810145884.8

(51) Int. Cl.
*G02B 9/16* (2006.01)
*G06T 7/521* (2017.01)
(Continued)

(52) U.S. Cl.
CPC .............. *G06T 7/521* (2017.01); *G02B 7/021* (2013.01); *G02B 9/16* (2013.01); *G06K 9/00664* (2013.01);
(Continued)

(58) Field of Classification Search
CPC .......... G02B 9/16; G02B 7/02; H04N 13/207; H04N 5/225; H04N 13/254; G06K 9/00; H04R 1/34
See application file for complete search history.

(56) References Cited

U.S. PATENT DOCUMENTS 5,706,093 A * 1/1998 Komiya .................... G01J 3/51
                                                         356/418
8,390,821 B2  3/2013  Shpunt et al.
(Continued)

FOREIGN PATENT DOCUMENTS

CN    101620366       1/2010
CN    107026392 A     8/2017
(Continued)

*Primary Examiner* — Chikaodili E Anyikire
*Assistant Examiner* — Berteau Joisil
(74) *Attorney, Agent, or Firm* — ScienBiziP, P.C.

(57) ABSTRACT

An optical projector module to establish distance to target object in a field of view for three dimensional image acquisition purposes includes a printed circuit board, point light sources mounted on the printed circuit board to emit a plurality of light beams, a lens unit apart from the plurality of point light sources, and a distance adjusting unit connected to the lens unit. A memory storage device is also included. The lens unit comprises separated lenses, the adjusting unit can adjust distances between the lenses of the lens unit, and light beams with a number of light spot patterns can accordingly be projected. Previously-captured images in the memory storage device can be referred to in seeking target objects in the field of view and light beams in different spot-concentrations on or around the target object enable calculations for the capture of images in three dimensions of the target object.

11 Claims, 12 Drawing Sheets

(51) Int. Cl.
*H05K 1/18* (2006.01)
*G02B 7/02* (2021.01)
*H04N 13/207* (2018.01)
*H04N 5/225* (2006.01)
*H04N 13/254* (2018.01)
*H04R 1/34* (2006.01)
*G06K 9/00* (2006.01)
*H01S 5/42* (2006.01)

(52) U.S. Cl.
CPC ......... *H04N 5/2252* (2013.01); *H04N 5/2256* (2013.01); *H04N 13/207* (2018.05); *H04N 13/254* (2018.05); *H04R 1/342* (2013.01); *H05K 1/181* (2013.01); *G06K 2209/21* (2013.01); *G06T 2207/10028* (2013.01); *H01S 5/423* (2013.01); *H05K 2201/10121* (2013.01); *H05K 2201/10522* (2013.01)

(56) References Cited

U.S. PATENT DOCUMENTS

| | | | | |
|---|---|---|---|---|
| 2006/0022935 | A1* | 2/2006 | Sakai | G02B 6/0076 345/102 |
| 2007/0014021 | A1* | 1/2007 | Gerets | H04N 5/7416 359/619 |
| 2007/0047092 | A1* | 3/2007 | Tsai | G02B 17/08 359/642 |
| 2011/0176193 | A1* | 7/2011 | Maeda | G02B 26/123 359/204.3 |

FOREIGN PATENT DOCUMENTS

| | | |
|---|---|---|
| CN | 206411409 U | 8/2017 |
| CN | 107132720 | 9/2017 |

\* cited by examiner

OPTICAL PROJECTOR MODULE, THREE-DIMENSIONAL IMAGE SENSING APPARATUS, AND METHOD OF SENSING

FIELD

The subject matter herein generally relates to three-dimensional image sensing.

BACKGROUND

Depth of a target object in a field of view can be obtained via an optical projector module. Such optical projector module can project a fixed number of light beams on a target object, but it is difficult to determine facial features of a human in the field of view.

Therefore, there is room for improvement within the art.

BRIEF DESCRIPTION OF THE DRAWINGS

Implementations of the present technology will now be described, by way of embodiments only, with reference to the attached figures.

DETAILED DESCRIPTION

Figure 1:
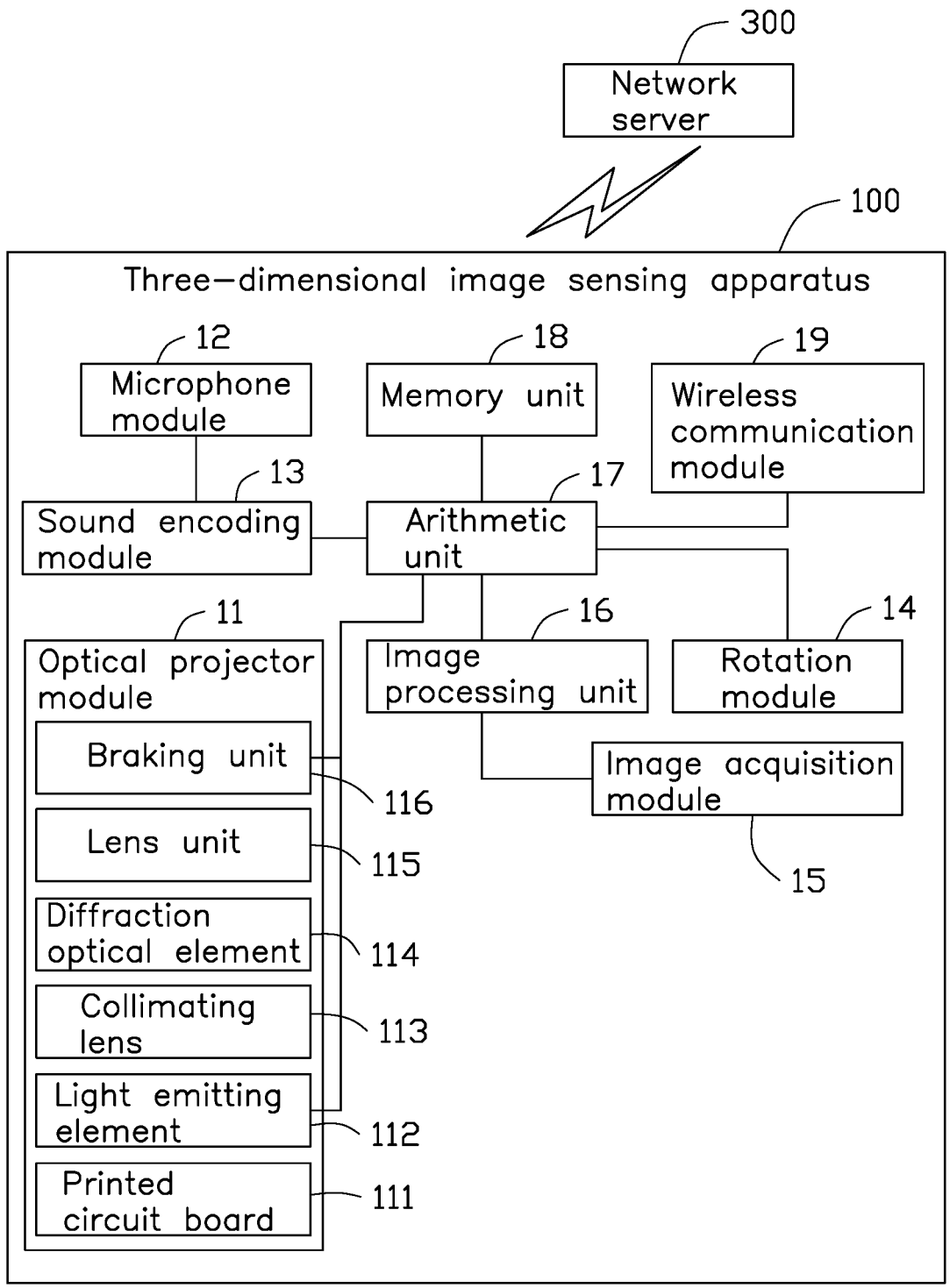
FIG. 1 shows architecture of an embodiment of a three-dimensional image sensing apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

FIG. 1 illustrates a three-dimensional image sensing apparatus 100. The three-dimensional image sensing apparatus 100 includes an optical projector module 11, a microphone module 12, a sound encoding module 13, a rotation module 14, an image acquisition module 15, an image processing unit 16, an arithmetic unit 17, and a memory unit 18.

Figure 2:
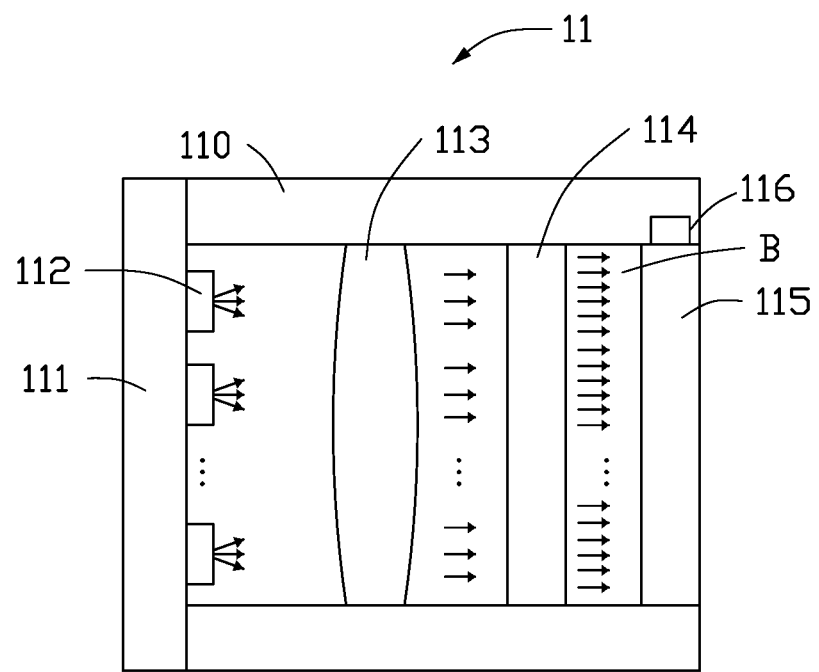
FIG. 2 is a cross-sectional view of an optical projector module in the three-dimensional image sensing apparatus in FIG. 1.

As shown in FIG. 2, the optical projector module 11 is configured to generate a structured light pattern and includes a lens barrel 110, a printed circuit board 111, at least one light source 112, an optical member 113, a light spots generating unit 114, a lens unit 115, and an adjusting unit 116. The lens barrel 110 is mounted on the printed circuit board 111. The optical member 113, the light spots generating unit 114, and the lens unit 115 are mounted in the lens barrel 110. In the embodiment, the at least one light source 112 includes a plurality of light sources 112 emitting light, and the plurality of light sources 112 are mounted on the printed circuit board 111. The light source 112 also can be a laser to emit visible light, non-visible light such as infrared, ultraviolet, and so on. In the embodiment, the light source 112 is a vertical cavity surface-emitting laser (VCSEL).

The optical member 113 is a convex lens. The optical member 113 is disposed in a light path of the light sources 112 for receiving light beams emitted from the light sources 112 and collimating the light beams. For example, the divergent light beams emit by the VCSEL can be collimated into parallel beams, to ensure that the beam energy emitted by the light source 112 is more concentrated.

The light spots generating unit 114 can be a diffraction optical element (DOE) disposed in a light path of the optical member 113 for expanding or splitting the light beams from the optical member 113, and then forming structured light pattern. In one embodiment, a number of the light beams emitted by the at least one light source 112 may be 70. That is, the number of light beams transmitted to the spot generating unit 114 via the optical member 113 is 70. The light spots generating unit 114 expands or splits the light beams at a certain magnification. In one embodiment, the magnification can be 50 times; thereby, a number of the light beams B expanded or split from the light spots generating unit 114 is 3500, and then the light beams B are projected to a target area through the lens unit 115, to produce 3500 light spots on a target area. In other embodiments, there will be some overlap of light spots, resulting in the number of the light spots being less than 3500.

In other embodiments, the light spots generating unit 114 is not limited to a light spots generating unit (DOE), a grating or a combination of various optical elements may be used for diverging or splitting light beams.

Figure 3:
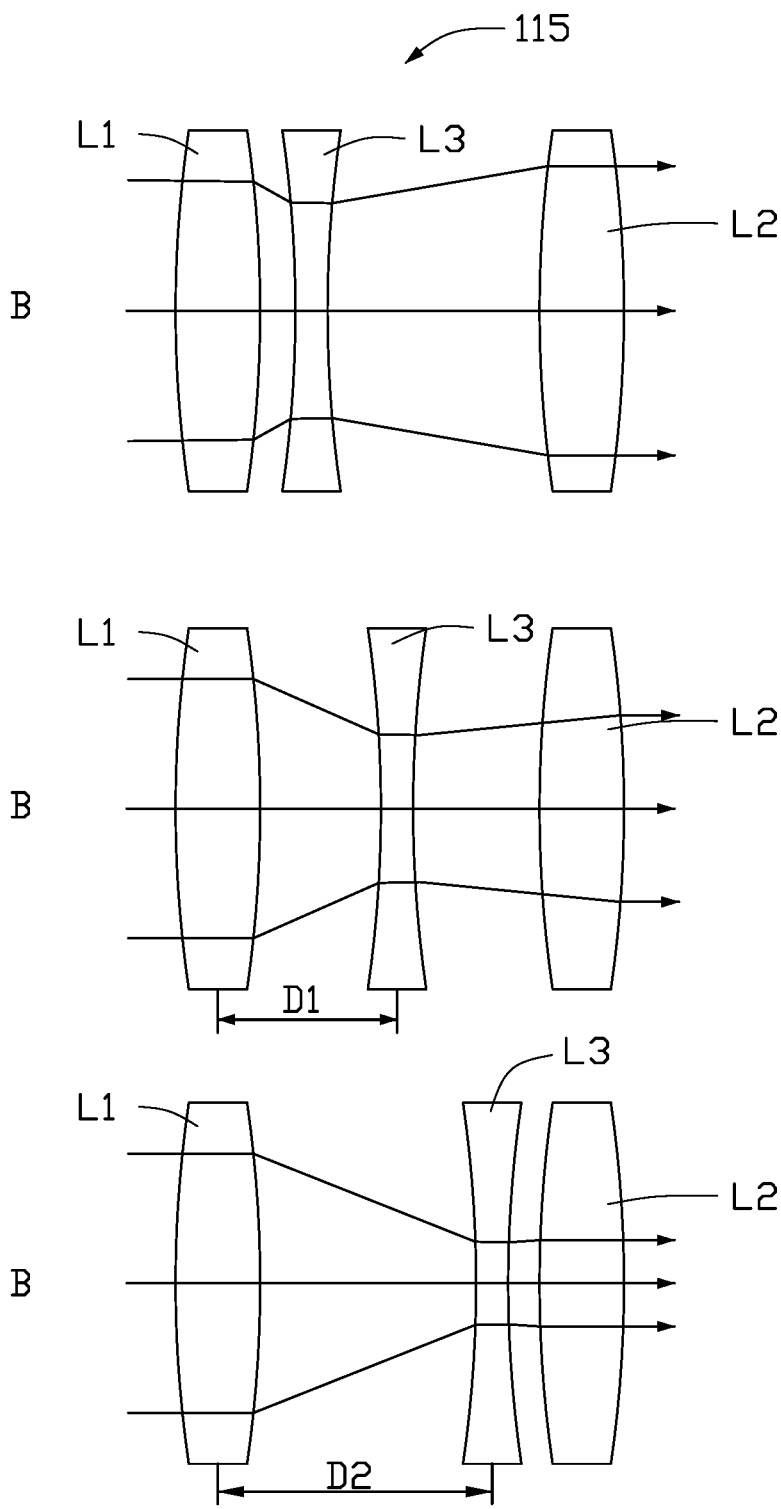
FIG. 3 is a cross-sectional view of a lens unit in the optical projector module in FIG. 2, the lens unit comprising three lenses.

Referring to FIG. 3, the lens unit 115 is disposed in a light path of the light spots generating unit 114 and spaced apart from the light spots generating unit 114. The lens unit 115 receives the light beams B that are diverged or split by the light spots generating unit 114. The lens unit 115 includes a plurality of lenses, and the plurality of lenses are spaced apart from each other. In the embodiment, the lens unit 115 includes three lenses: a first convex lens L1, a second convex lens L2, and a concave lens L3. The first convex lens L1 is disposed adjacent to the light spots generating unit 114 to receive light beams B. The second convex lens L2 is disposed on one side of the first convex lens L1 away from the light spots generating unit 114. The concave lens L3 is disposed between the first convex lens L1 and the second convex lens L2. In other embodiments, the number of lenses and the type of lenses in the lens unit 115 may be adjusted in accordance with specific requirements.

As shown in FIG. 2, the adjusting unit 116 is can be a stepper motor, a voice coil motor, or other motive element. The adjusting unit 116 is connected to the lens unit 115 and configured to adjust distances between the plurality of lenses of the lens unit 115, and then, changing a light spot density of a structured light pattern. When the distance between the two lenses is increased, a light spot density of a structured light pattern is also increased. Thereby, the light beams B output by the light spots generating unit 114 form a different concentration through the lens unit 115, that is, to change a spot density on a target area. In the embodiment, the adjusting unit 116 is configured to adjust a distance between the first convex lens L1 and the concave lens L3, to ensure that the light beams B output by the light spots generating unit 114 forms a different concentration through the lens unit 115.

Figure 4:
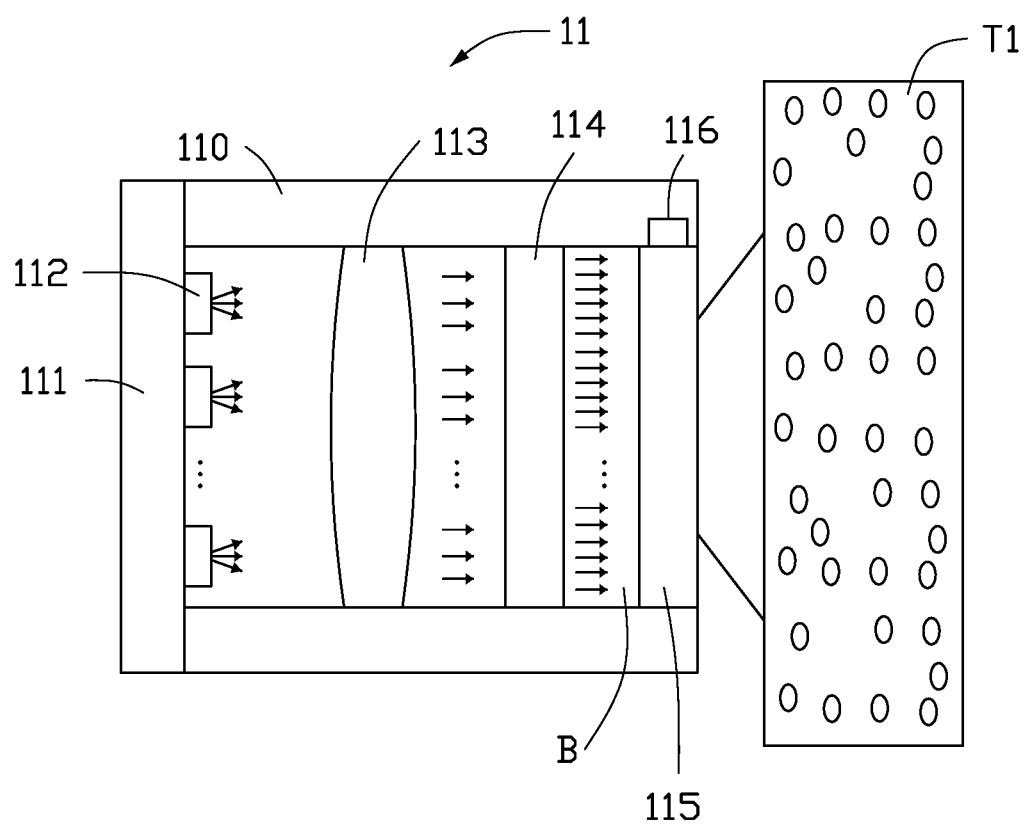
FIG. 4 is a schematic diagram of a first light point density generated by the optical projector module in FIG. 2.

Referring to FIGS. 3 and 4, the adjusting unit 116 drives the concave lens L3 to move away from the first convex lens L1 and closer to the second convex lens L2. At this time, a distance between the first convex lens L1 and the concave lens L3 is D1. The light beams B output by the light spots generating unit 114 is received by the lens unit 115, and the light beams B sequentially pass through the first convex lens L1, the concave lens L3, and the second convex lens L2, and then light beams form a first light spot pattern T1. The first light spot pattern T1 is projected to a target area by the lens unit 115.

Figure 5:
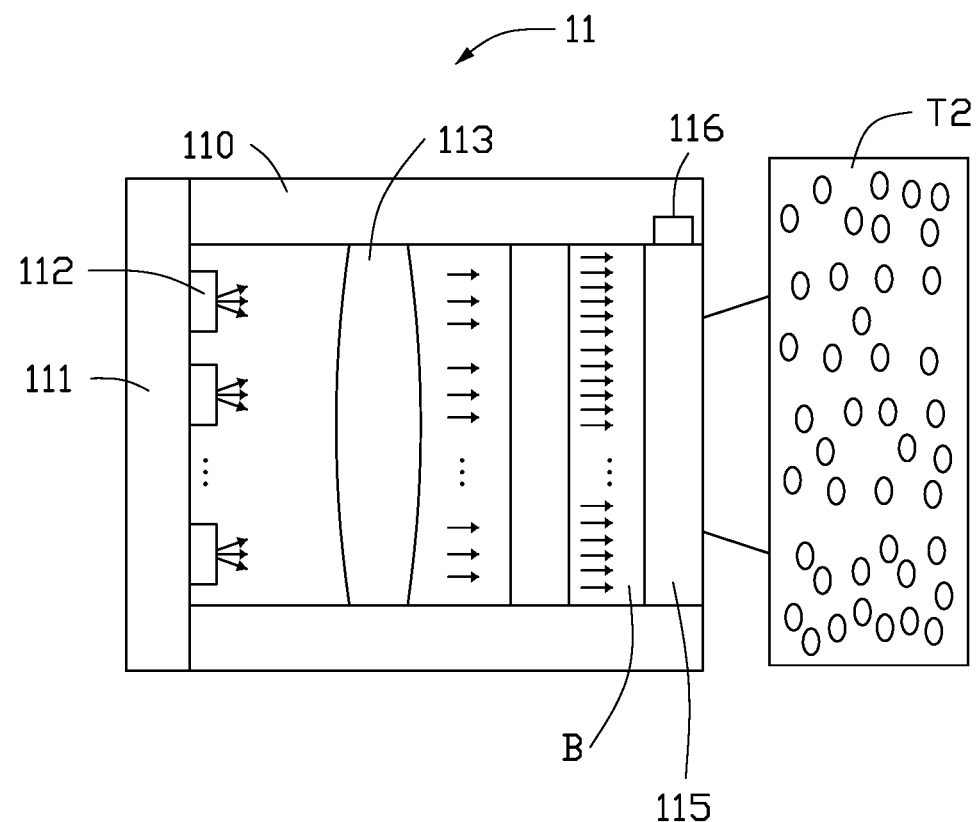
FIG. 5 is a schematic diagram of a second light point density generated by the optical projector module in FIG. 2.

Referring to FIGS. 3 and 5, the adjusting unit 116 continues to adjust the concave lens L3 by driving the concave lens L3 further away from the first convex lens L1 and closer to the second convex lens L2. At this time, a distance between the first convex lens L1 and the concave lens L3 is D2, and D2 is greater than D1. The light beams B output by the light spots generating unit 114 are incident on the lens unit 115, and sequentially pass through the first convex lens L1, the concave lens L3, and the second convex lens L2, and then, the light beams forms a second light spot pattern T2. The second light spot pattern T2 is projected to a target area by the lens unit 115. As shown in FIGS. 4 and 5, the light spot density of the second light spot pattern T2 is significantly larger than the light spot density of the first light spot pattern T1. That is, when the distance between the first convex lens L1 and the concave lens L3 is gradually increased, the light beams output by the lens unit 115 is more dense. That is, by adjusting the distance between the plurality of lenses in the lens unit 115, the light spot density of the light beams projected to the target area can be effectively controlled, so that the light spots are concentrated, or concentrated in a different way, on the target object. In other embodiments, the adjusting unit 116 may also adjust a distance between any two lenses to achieve the same purpose.

Referring to FIG. 1 again, the microphone module 12 includes a plurality of microphone units to receive any sound produced by a target object. The sound encoding module 13 is electrically connected to the microphone module 12 and the arithmetic unit 17. The sound encoding module 13 is configured to convert an analog sound received by the microphone module 12 into a digital sound signal, and transmit the digital sound signal to the arithmetic unit 17.

The rotation module 14 is included in the three-dimensional image sensing device 100. The rotation module 14 rotates the optical projector module 11 within a specific angle. The rotation module 14 may be any rotating mechanism that can control a rotation of the optical projector module 11. In one embodiment, the rotating mechanism comprising of at least one motor and at least one gear driven by the motor.

The image acquisition module 15 may be a monochrome camera. The image acquisition module 15 is electrically connected to the image processing unit 16. The image acquisition module 15 acquires a light spot image of a target area when the light projection module 11 outputs the beam projected to the target area, and transmits the light spot image to the image processing unit 16.

The image processing unit 16 is electrically connected to the image acquisition module 15. The image processing unit 16 receives the light spot image acquired by the image acquisition module 15, performs image analysis and processing, determines whether a target object exists in a target area, and outputs a corresponding signal to the arithmetic unit 17 according to the determination. For example, when a target object exists in the target area, the image processing unit 16 outputs a first signal to the arithmetic unit 17. When a target object does not exist in the target area, the image processing unit 16 outputs a second signal to the arithmetic unit 17.

In the embodiment, when a target object exists in a target area, the image processing unit 16 is further configured to calculate a distance between the three-dimensional image sensing device 100 and the target object. An area of the target object is also calculated, as is a relative position of the target object in the spot image, and a depth information of the target object according to the received spot image.

In the embodiment, the first signal at least includes the distance, the area, the relative position, and the depth information.

The arithmetic unit 17 may be a central processing unit (CPU) or any arithmetic circuit with operational capability. The arithmetic unit 17 is electrically connected to the sound encoding module 13, the rotation module 14, the image processing unit 16, the light source 112, and the adjusting unit 116. The arithmetic unit 17 receives a digital sound signal transmitted from the sound encoding module 13 and processes the digital sound signal to determine a sound source direction. The arithmetic unit 17 also outputs a first rotation signal according to the sound source direction, the first rotation signal rotates the rotation module 14 through a specific angle, and the optical projector module 11 is thus turned to the sound source direction.

When the arithmetic unit 17 receives the first signal from the image processing unit 16, it is indicated that a target object exists in a target area. The first signal includes at least one from the distance, the area, the relative position, and the depth information, or all of them. Meanwhile, the arithmetic unit 17 outputs a second rotation signal to the rotation module 14 according to the relative position, to control the rotation of the rotation module 14, and then fine-tune the direction of the optical projector module 11, so that the optical projector module 11 is accurately directed toward the target object. Simultaneously, the arithmetic unit 17 also outputs a signal to the brake unit 116 according to the distance between the three-dimensional image sensing device 100 and the target object, and further controls the adjusting unit 116 to adjust the distance between the lenses in the lens unit 115, to adjust the light spot density projected to the target area. The light spots can thus be concentrated to the target object, thereby, the image acquisition module 15 can accurately capture image of the second light spots, and further establish the depth information of the target object.

When the arithmetic unit 17 receives a second signal from the image processing unit 16, it is indicated that there is no target object within the target area. At this time, the arithmetic unit 17 is further configured to output a third rotation signal, thereby controlling the optical projector module 11 to rotate a preset angle. The light source 112 of the optical projector module 11 begins to perform a second projection to continue to find the target object within a new target area.

Figure 6:
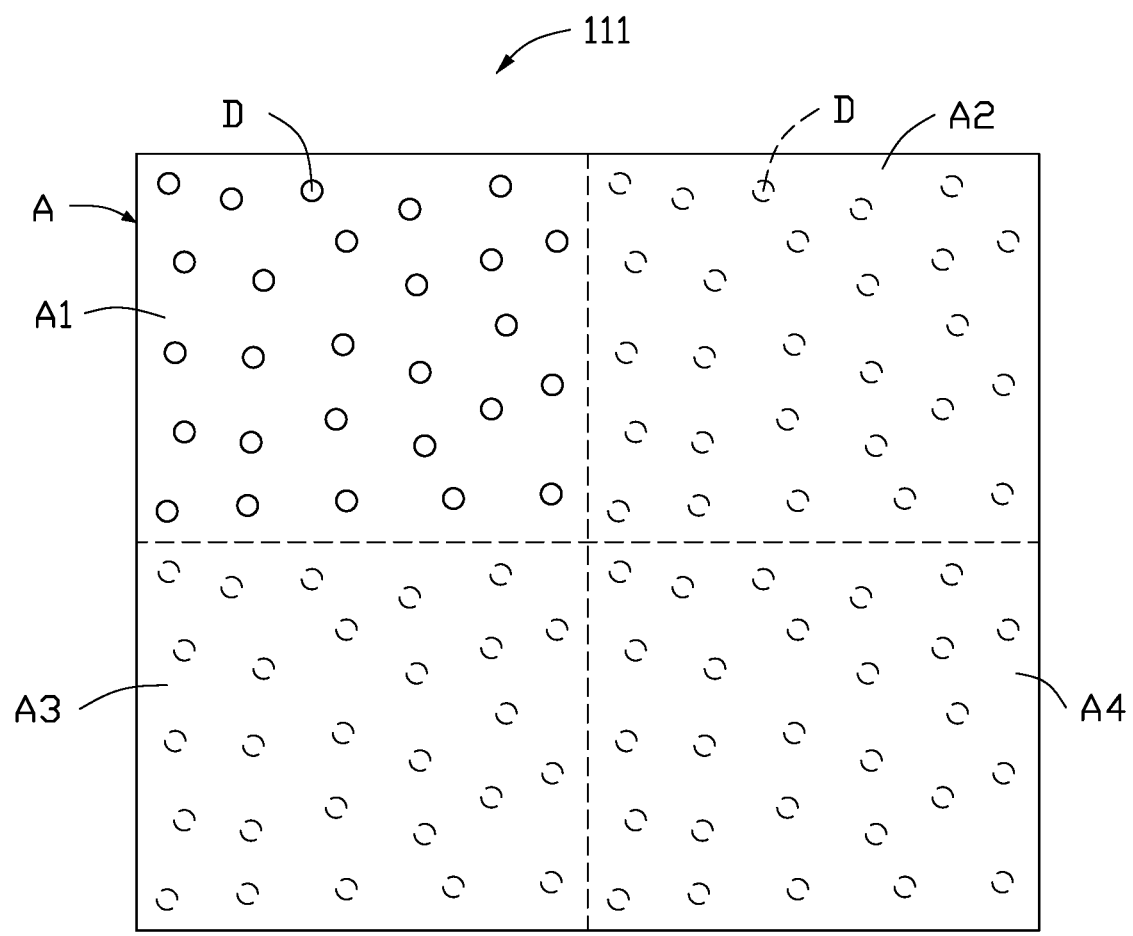
FIGS. 6-7 are schematic diagrams of light sources arranged on a printed circuit board in a array, the array being divided into a plurality of sub-arrays, each sub-array being independently controlled

Referring to FIG. 6, the light source 112 includes a plurality of point light sources D. The light sources D are arranged on the printed circuit board 111 to emit a plurality of light beams. The plurality of point light sources D can a form circular shape, a diamond shape, square, or a triangle shape. The plurality of point light sources D forms a light spot array A. The light spot array A can be divided into a plurality of sub-arrays, such as sub-arrays A1, A2, A3, and A4, each sub-array being independently controlled. When the image processing unit 16 determines that a target object does not exist in a target area, the arithmetic unit 17 is further configured to control turning on and off of the light source 112, to adjust a number of light spots projected by the optical projector module 11, and then continue to find the target object.

Figure 7:
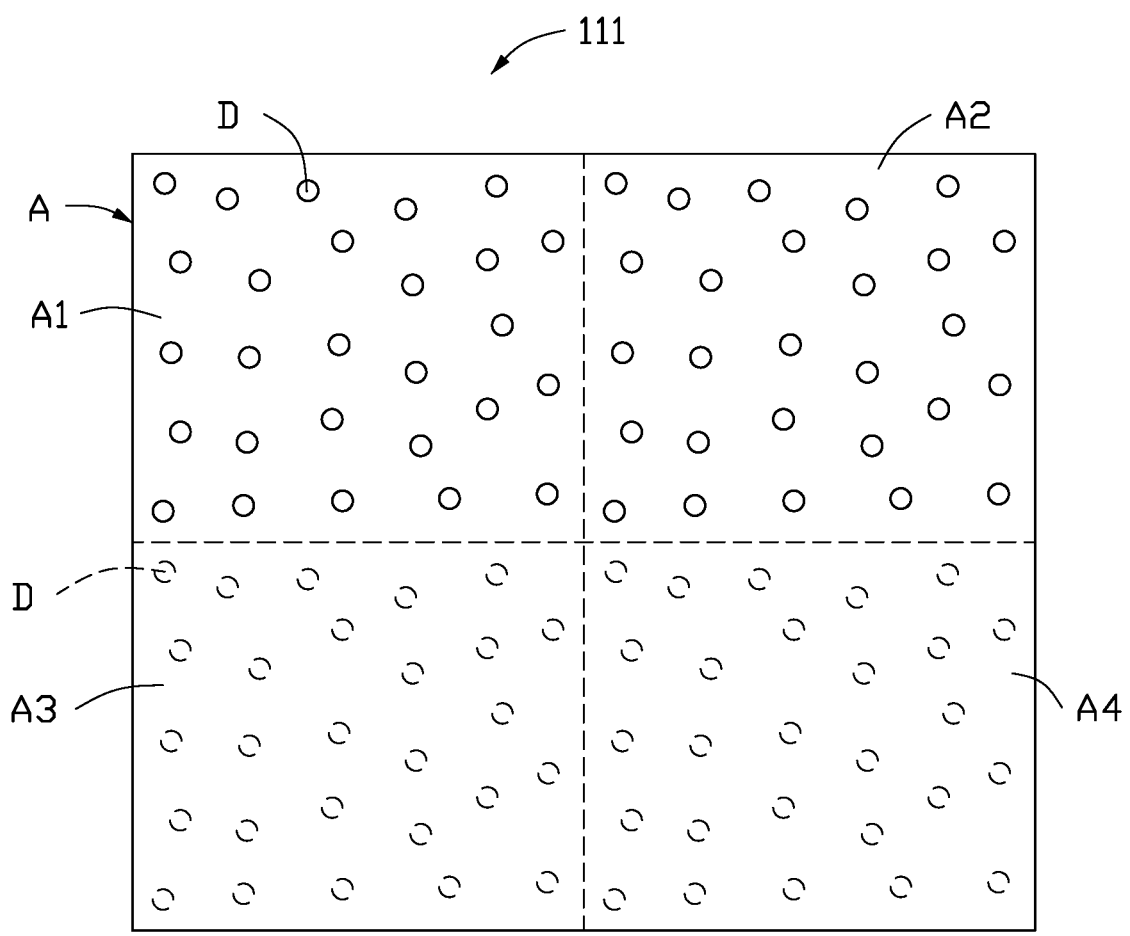

For example, when the optical projector module 11 first projects light spots, the arithmetic unit 17 only controls a part of light sources 112 to turn on, for example, only the sub-array A1 of the point light source D is turned on, so that only the sub-array A1 emits light beams, the other sub-arrays do not emit light beams (see FIG. 6). Referring to FIG. 7, when a target object is not found in the target area, the arithmetic unit 17 may control a certain number of light sources 112 to be turned on, for example, the point light sources of the sub-arrays A1, A2 are turned on, and the sub-arrays A1, A2 emit light beams. By increasing the number of light spots projected by the optical projector module 11 by increasing the emission beam of the light sources 112, the light spot projection range can be effectively enlarged, and finding a target object in a new target area becomes easier.

In other embodiment, when a target object exists in the target area, the arithmetic unit 17 may also control and adjust the number of light spots projected by the optical projector module 11 according to the area of the target object. For example, when the area of the target object is less than a preset area, the arithmetic unit 17 is configured to reduce the number of light spots projected by the optical projector module 11 such that only the point light sources D of the sub-arrays A1 are turned on, as shown in FIG. 6. When the area of the target object is larger than the preset area, the arithmetic unit 17 can increase the number of light spots projected by the optical projector module 11, for example, the point light sources D of the sub-arrays A1, A2 are turned on, as shown in FIG. 7. This ensures that the light spots projected by the optical projector module 11 completely cover the target object, thereby ensuring the accuracy and the completeness of the image acquisition of the target object.

In other embodiments, the image processing unit 16 may be integrated in the arithmetic unit 17, to achieve the same purpose as described above.

The memory unit 18 is electrically connected to the arithmetic unit 17 for storing functional modules running in the three-dimensional image sensing device 100, and various parameters of the three-dimensional image sensing device 100. The memory unit 18 is also configured to store image data for facilitating the image processing unit 16 or the arithmetic unit 17 to compare the spot image acquired by the image acquisition module 15 with images pre-stored in the image database.

Referring again to FIG. 1, the three-dimensional image sensing apparatus 100 further includes a wireless communication module 19. The wireless communication module 19 is connected to the arithmetic unit 17 for transmitting and receiving a wireless communication signal. The three-dimensional image sensing apparatus 100 is configured to transmit data to a network server 300 to process and analyze via the wireless communication module 19. The data can be light spot images captured by the image acquisition module 15. The apparatus 100 also receives the result of analysis from the network server 300 and governs the arithmetic unit 17 to perform a corresponding function.

In the embodiment, the three-dimensional image sensing apparatus 100 and the network server 300 together form a three-dimensional image sensing system 500 for sensing and analyzing the three-dimensional image depth information, as shown in FIG. 1.

Figure 8:
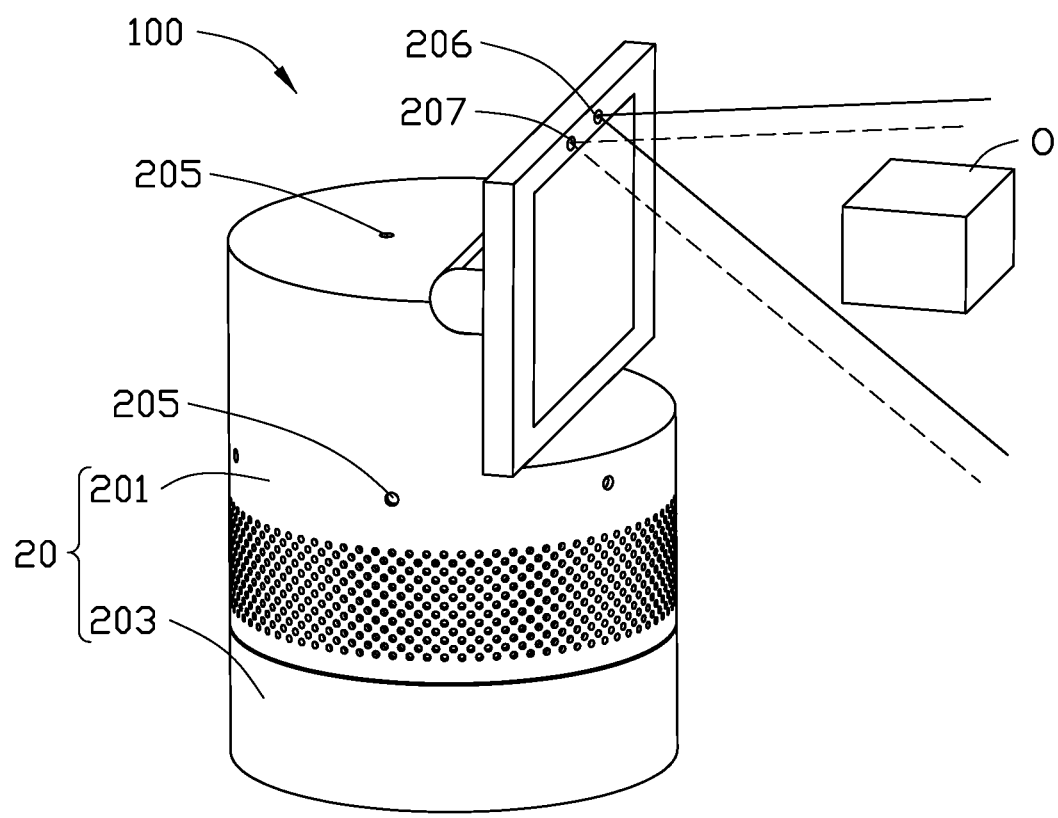
FIG. 8 is an isometric view of a three-dimensional image sensing apparatus in accordance with one embodiment.

Referring to FIG. 8, the three-dimensional image sensing device 100 further includes a housing 20. The housing 20 includes an upper housing 201 and a lower housing 203. In the embodiment, the rotation module 14 is disposed in the housing 20 and configured to drive the upper housing 201 and the lower housing 203 to rotate relative to each other. The optical projector module 11 is provided in the upper housing 201. When the rotation module 14 drives the upper housing 201 and the lower housing 203 to rotate relative to each other, the rotation of the optical projector module 11 is driven in synchronization.

In the embodiment, the housing 20, such as the upper housing 201, is provided with a plurality of microphone through-holes 205. The microphone module 12 is disposed within the housing 20 to receive sound through the microphone through-holes 205.

In the embodiment, the three-dimensional image sensing apparatus 100 is further provided with a light exiting hole 206 and a light entrance hole 207. The light exiting hole 206 is aligned to the optical projector module 11, and light beams projected from the optical projector module 11 are incident on an object O through the light exiting hole 206. The light entrance hole 207 is disposed to correspond to the image-acquisition module 15, and the image acquisition module 15 is configured to receive a light spot image through the light entrance hole 207.

Figure 9:
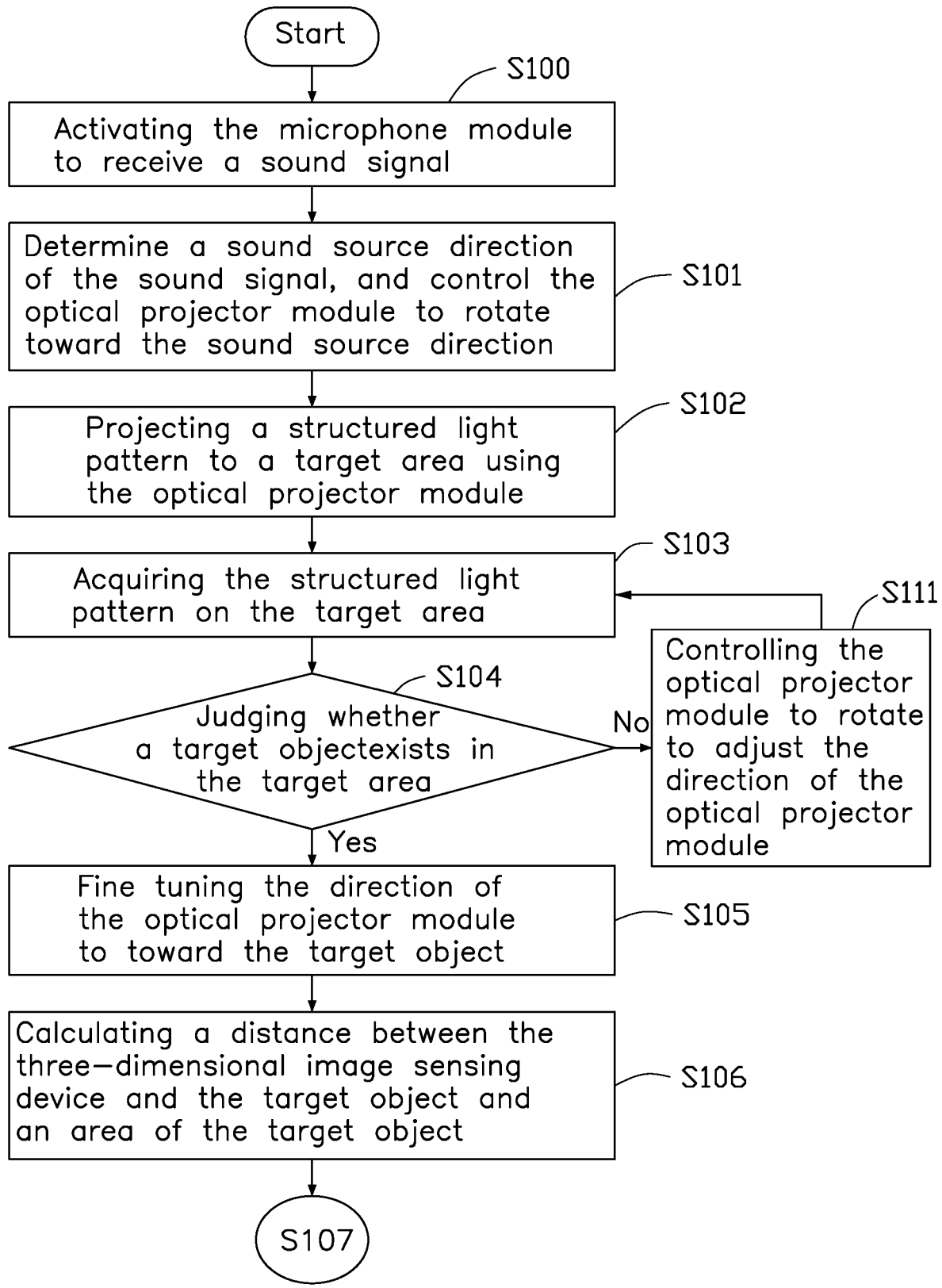
FIG. 9 is a flowchart of a method for three-dimensional sensing system applied to the three-dimensional image sensing device in FIG. 2.
Figure 10:
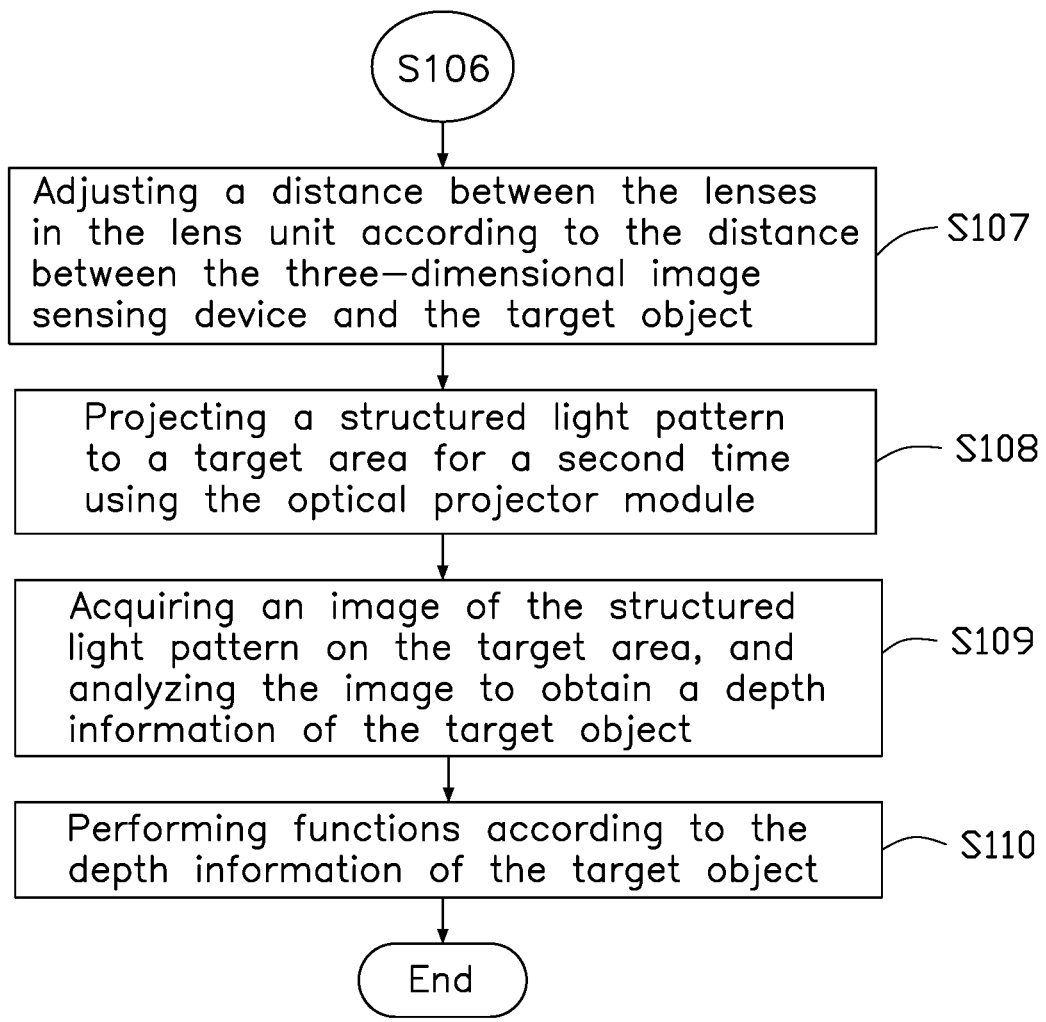
FIG. 10 is another flowchart of a method for a three-dimensional sensing system.

FIGS. 9 and 10 illustrate a three-dimensional sensing method for the three-dimensional image sensing device 100 according to one embodiment of the present application. The sensing method is provided by way of example as there are a variety of ways to carry out the method. The method 1 can begin at Step S100.

Step S100: the microphone module 12 is activated to receive a sound, the sound is produced by a target object.

Step S101: the sound is processed to determine a sound source direction, and the optical projector module 11 is controlled to rotate to toward the sound source direction.

Figure 11:
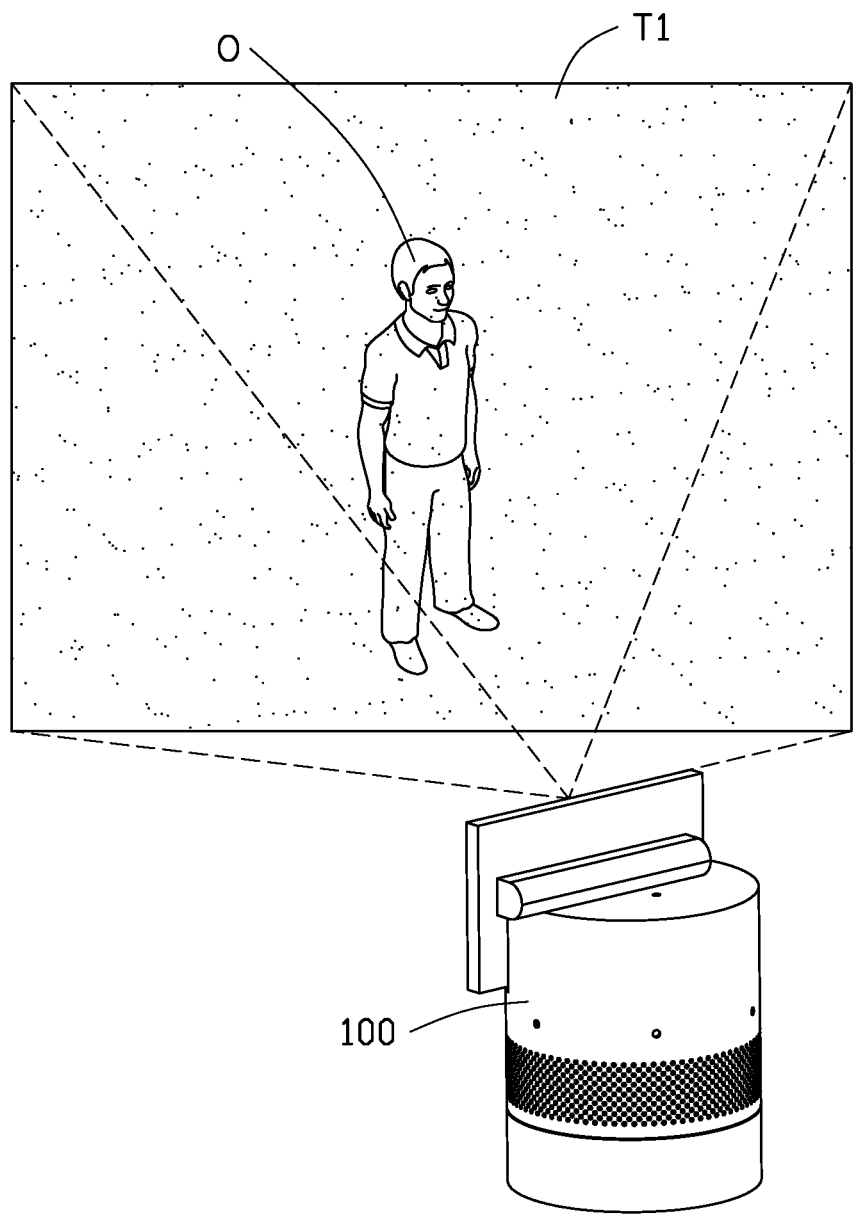
FIG. 11 is a schematic diagram of a first projection of the optical projector module of FIG. 2 to a target area.

Step S102, referring to FIG. 11, the optical projector module 11 is turned on, and the optical projector module 11 projects a light spot pattern T1 with a specific density to a target area.

Step S103: a light spot image of the light spot pattern T1 to the target area is acquired.

Step S104, a light spot image of the light spot pattern T1 is subjected to an image analysis and process to determine whether a target object O exists in the target area. When the target object O exists in the target area, step S105 is executed. When the target object O does not exist in the target area, step S111 is executed.

Step S105: When the target object O exists in the target area, the optical projector module 11 is controlled to rotate according to a relative position of the target object O in the light spot image of the light spot pattern T1 to fine tune the direction of the optical projector module 11, and the optical projector module 11 is oriented exactly towards the target object O.

Step S106: a distance between the three-dimensional image sensing device 100 and the target object O and an area of the target object O are calculated, respectively.

Step S107: the distance between the lenses in the lens unit 115 is adjusted according to the distance between the three-dimensional image sensing device 100 and the target object O.

Figure 12:
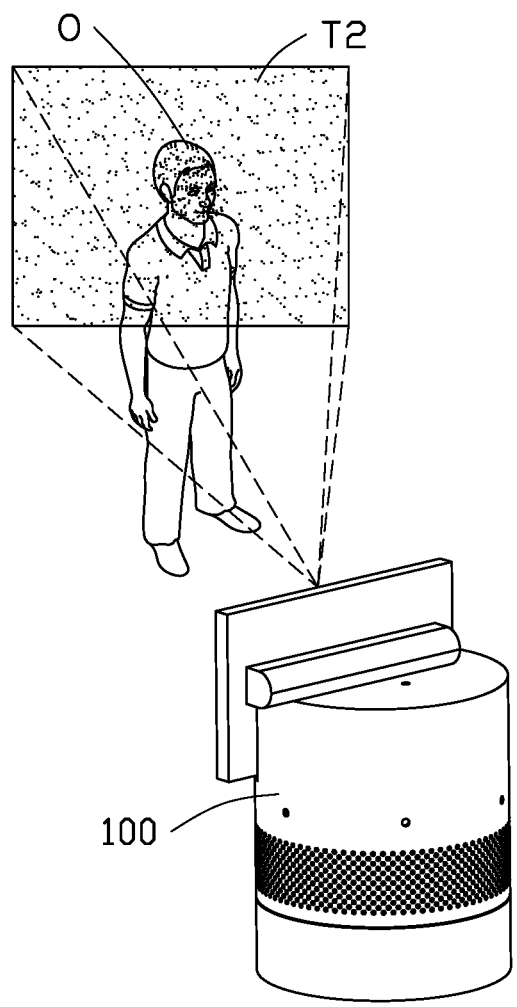
FIG. 12 is a schematic diagram of a second projection of the optical projector module to a target area.

Step S108: The optical projector module 11 is turned on to perform a second projection. As shown in FIG. 12, when the distance between the lenses in the lens unit 115 is adjusted and the optical projector module 11 is subjected to a second projection, the density of the light spots to the target area can be effectively controlled and adjusted, so that the light spots are concentrated to the target object O, so that the image acquisition module 15 accurately captures a light point image of the second light spot pattern T2, and further to obtain a depth information of the target object O.

In step S108, the number of light spots projected by the optical projector module 11 may also be controlled according to an area of the target object O. For example, when the area of the target object O is less than a preset area, the number of light spots projected by the optical projector module 11 may be appropriately reduced. When the area of the target object O is larger than the preset area, the number of light spots projected by the optical projector module 11 can be appropriately increased. This ensures that the light spots projected by the optical projector module 11 covers the target object O more completely, and further ensures an accuracy and the completeness of the image acquisition of the target object.

Step S109: a light spot image of the light spot pattern T2 on the target area is acquired, and the light spot image is processed and analyzed to obtain the depth information of the target object O. The light spot density of the light spot pattern T2 is greater than a light spot density of the light spot pattern T1.

Step S110: functions are performed according to the depth information of the target object O. In one embodiment, the three-dimensional image sensing apparatus 100 may recognize the designated user according to the depth information of the target object O and authorize the user. That is, the user is allowed to operate the three-dimensional image sensing device 100 to allow the user to operate other electronic devices through the three-dimensional image sensing device 100.

Step S111: when the image processing unit 16 determines that a target object does not exist in a target area, the optical projector module 11 is controlled to rotate to adjust the direction of the optical projector module 11, and return to step S102. That is, the optical projector module 11 is turned on again so that the optical projector module 11 projects a light spot pattern T1 with a specific density to a new target area, and then searches for the target object O in the new target area. That is, the optical projector module 11 of the 3D image sensing device 100 is first configured to find the target object through a first projection. When the target object is found, the optical projector module 11 is controlled to perform a second projection and the light spot density of the second projection is adjusted, so that the second projection can be accurately positioned to the target object. The optical projection module 11 performs a rough scan of the target object with a certain light spot density at a first projection, and then executes a second projection with fine sweep to the target object when finding the target object, for changing the light spot density. Thus, a power consumption of the three-dimensional image sensing device 100 can be saved effectively, which is more practical and convenient.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A three-dimensional image sensing apparatus comprising:
    an optical projector module, comprising:
        a printed circuit board;
        a plurality of point light sources mounted on the printed circuit board to emit a plurality of light beams;
        a lens unit positioned apart from the plurality of point light sources, wherein the lens unit comprises a plurality of lenses spacing apart from each other; and
        an adjusting unit connecting to the lens unit, wherein the adjusting unit adjusts distances between the plurality of lenses of the lens unit such that light beams with a first light spot pattern and light beams with a second light spot pattern are respectively projected to a target area, and a light spot density of the second light spot pattern is larger than a light spot density of the first light spot pattern;
    an image acquisition module being electrically connected to the optical projector module, wherein the image acquisition module acquires an image of the first light spot pattern on the target area;
    an arithmetic unit being electrically connected to the image acquisition module, wherein the arithmetic unit receives the image of the first light spot pattern and determines whether a target object exists in the target area according to the received image, when it is determined that the target object exists in the target area, the arithmetic unit controls the optical projector module to project the second light spot pattern to the target object;

a microphone module; and a rotation module;

wherein the arithmetic unit is electrically connected to the microphone module and the rotation module, the microphone module receives a sound produced by the target object and transmits the sound to the arithmetic unit, the arithmetic unit further receives the sound, determines a direction of the sound source according to the sound and outputs a rotation signal, and the rotation module controls the optical projector module to rotate toward the sound source direction according to the rotation signal.

2. The three-dimensional image sensing apparatus of claim 1, further comprising an image processing unit, wherein the image processing unit is electrically connected to the image acquisition module, the image processing unit receives the image of the first light spot pattern acquired by the image acquisition module, performs image analysis and processing, determines whether the target object exists in the target area, and outputs a corresponding signal to the arithmetic unit.

3. The three-dimensional image sensing apparatus of claim 2, further comprising a housing, wherein the housing comprises an upper housing and a lower housing, and the rotation module is disposed in the housing, the rotation module drives the upper housing and the lower housing to rotate relative to each other.

4. The three-dimensional image sensing apparatus of claim 1, further comprising an optical member, wherein the optical member is disposed in a light path of the point light sources for receiving and collimating light beams.

5. The three-dimensional image sensing apparatus of claim 4, further comprising a light spots generating unit, wherein the light spots generating unit is positioned between the optical member and the lens unit, the light spots generating unit expands light beams from the optical member.

6. The three-dimensional image sensing apparatus of claim 5, wherein the point light source is a vertical cavity surface-emitting laser.

7. The three-dimensional image sensing apparatus of claim 6, wherein the plurality of point light sources form a light spot array, the light spot array is divided into a plurality of sub-arrays, and each of the plurality of sub-arrays is independently controlled.

8. The three-dimensional image sensing apparatus of claim 7, wherein the plurality of lenses comprises a first convex lens, a second convex lens, and a concave lens, the first convex lens is disposed adjacent to the light spots generating unit, and the second convex lens is disposed on one side of the first convex lens away from the light spots generating unit, the concave lens is disposed between the first convex lens and the second convex lens, and the adjusting unit adjusts a distance between the first convex lens and the concave lens.

9. A sensing method for a three-dimensional image comprising:

projecting light beams with a first light spot pattern to a target area by an optical projector module;

acquiring an image of the first light spot pattern on the target area;

determining whether a target object exists in the target area according to the image;

controlling the optical projector module to rotate toward the target object, and projecting a second light spot pattern to the target area when the target object exists in the target area, wherein a light spot density of the second light spot pattern is larger than a light spot density of the first light spot pattern;

receiving a sound and determining a direction of the source of the sound; and outputting a rotation signal to control the optical projector module to rotate toward the direction of the source of the sound.

10. The sensing method of claim 9, further comprising:

controlling the optical projector module to rotate to adjust a projection direction of a first light spot pattern when the target object does not exist in the target area.

11. The sensing method of claim 10, further comprising:

acquiring an image of a second light spot pattern on the target area, and analyzing and processing the image to obtain a depth information of the target object.

* * * * *